US 11,476,586 B2

(12) United States Patent
Ui et al.

(10) Patent No.: US 11,476,586 B2
(45) Date of Patent: Oct. 18, 2022

(54) RADIO WAVE ABSORBING MEMBER, RADIO WAVE ABSORBING STRUCTURE, AND INSPECTION APPARATUS

(71) Applicant: NITTO DENKO CORPORATION, Ibaraki (JP)

(72) Inventors: Takehiro Ui, Osaka (JP); Masatsugu Koso, Osaka (JP); Kazuhiro Fuke, Osaka (JP); Yuya Matsuzaki, Osaka (JP); Masataka Usui, Osaka (JP)

(73) Assignee: NITTO DENKO CORPORATION, Ibaraki (JP)

( * ) Notice: Subject to any disclaimer, the term of this patent is extended or adjusted under 35 U.S.C. 154(b) by 0 days.

(21) Appl. No.: 17/264,095

(22) PCT Filed: Jun. 5, 2020

(86) PCT No.: PCT/JP2020/022432
§ 371 (c)(1),
(2) Date: Jan. 28, 2021

(87) PCT Pub. No.: WO2020/246608
PCT Pub. Date: Dec. 10, 2020

(65) Prior Publication Data
US 2021/0249780 A1    Aug. 12, 2021

(30) Foreign Application Priority Data
Jun. 7, 2019  (JP) .............................. JP2019-106723

(51) Int. Cl.
*B32B 7/02*       (2019.01)
*H05K 9/00*      (2006.01)
*H01Q 17/00*    (2006.01)

(52) U.S. Cl.
CPC ........ *H01Q 17/004* (2013.01); *H01Q 17/008* (2013.01)

(58) Field of Classification Search
CPC .......... H05K 9/00; H01Q 17/00; H01Q 17/04; H01Q 17/02; H01Q 17/025; B32B 7/00; B32B 15/00; B32B 7/025
See application file for complete search history.

(56) References Cited

U.S. PATENT DOCUMENTS 4,774,148 A      9/1988  Goto
7,136,008 B2 *  11/2006  Aisenbrey .............. H05K 3/101
                                                                   428/313.5
(Continued)

FOREIGN PATENT DOCUMENTS

CN      108353521 A      7/2018
JP      2004-270143 A    9/2004
(Continued)

OTHER PUBLICATIONS

International Search Report dated Sep. 1, 2020, issued in counterpart International Application No. PCT/JP2020/022432 (2 pages).
(Continued)

*Primary Examiner* — Blane J Jackson
(74) *Attorney, Agent, or Firm* — WHDA, LLP (57) ABSTRACT

A radio wave absorbing member $1a$ includes a radio wave absorber 10 and a support 20 having a sheet shape. The radio wave absorber 10 includes a resistive layer 12, a reflective layer 14, and a dielectric layer 13. The reflective layer 14 reflects a radio wave. The dielectric layer 13 is disposed between the resistive layer 12 and the reflective layer 14 in the thickness direction of the reflective layer 14. The support 20 supports the radio wave absorber 10. The support 20 includes a matrix resin $20m$ and a flame retardant $20p$.

8 Claims, 5 Drawing Sheets

(56) References Cited

U.S. PATENT DOCUMENTS

| | | | |
|---|---|---|---|
| 10,189,971 B2 * | 1/2019 | Lima | C08J 7/044 |
| 2009/0011203 A1 * | 1/2009 | Mock | B32B 3/30 |
| | | | 428/213 |
| 2009/0324901 A1 * | 12/2009 | Hashiba | B32B 27/302 |
| | | | 428/195.1 |
| 2012/0093658 A1 * | 4/2012 | Appleton | B32B 38/1866 |
| | | | 416/241 R |
| 2018/0319138 A1 | 11/2018 | Ukei et al. | |
| 2018/0332742 A1 | 11/2018 | Yamagata et al. | |
| 2020/0128705 A1 | 4/2020 | Yamagata et al. | |
| 2021/0265738 A1 * | 8/2021 | Mutou | B32B 25/18 |

FOREIGN PATENT DOCUMENTS

| | | | |
|---|---|---|---|
| JP | 2006-60013 A | 3/2006 | |
| JP | 2006-86446 A | 3/2006 | |
| JP | 2018-56562 A | 4/2018 | |
| JP | 2019-071463 A | 5/2019 | |
| JP | 2020-167412 A | 10/2020 | |
| JP | 2020167412 A * | 10/2020 | B32B 27/18 |
| TW | 201233319 A | 8/2012 | |
| WO | WO-2008051140 A1 * | 5/2008 | H01Q 17/00 |
| WO | 2018/230094 A1 | 12/2018 | |

OTHER PUBLICATIONS

Written Opinion dated Sep. 1, 2020, issued in counterpart International Application No. PCT/JP2020/022432, with English translation (6 pages).

Notification of Reasons for Refusal dated Dec. 1, 2020, issued in counterpart JP Patent Application No. 2020-553670, w/English translation (13 pages).

Office Action dated Jun. 2, 2021, issued in counterpart CN Application No. 202080004553.8, with English Translation. (10 pages).

Extended (Supplementary) European Search Report dated Feb. 4, 2022, issued in counterpart EP Application No. 20817640.4. (11 pages).

Office Action dated Mar. 16, 2022, issued in counterpart CN application No. 202080004553.8, with English translation. (11 pages).

* cited by examiner

RADIO WAVE ABSORBING MEMBER, RADIO WAVE ABSORBING STRUCTURE, AND INSPECTION APPARATUS

TECHNICAL FIELD

The present invention relates to a radio wave absorbing member, a radio wave absorbing structure, and an inspection apparatus.

BACKGROUND ART

λ/4 radio wave absorbers have been known. λ/4 radio wave absorbers show a higher return loss than that of other radio wave absorbers such as magnetic loss-type radio wave absorbers. Therefore, it is conceivable that in order to absorb unnecessary radio waves, λ/4 radio wave absorbers are used, for example, in millimeter-wave radar systems to be mounted on vehicles or in facilities where millimeter-wave radar systems are inspected.

In a known form of λ/4 radio wave absorbers, a resistive layer, a dielectric layer, and an electrically conductive layer are laminated in this order. The dielectric layer, which is commonly made of a resin material, is flammable. Therefore, it is advantageous that the flame retardancy of the λ/4 radio wave absorbers is improved in the case where the λ/4 radio wave absorbers are used, as stated above, in devices to be mounted on vehicles or in facilities where such devices are inspected.

For example, Patent Literature 1 describes provision of a glass layer on the surface of a λ/4 radio wave absorber. This allows protection of the radio wave absorber from burning due to, for example, an undesired fire.

CITATION LIST

Patent Literature

Patent Literature 1: JP 2006-086446 A

SUMMARY OF INVENTION

Technical Problem

In the case of the technique described in Patent Literature 1, the flexibility of the radio wave absorber must be very low because of the glass layer disposed on the surface of the radio wave absorber. Accordingly, the radio wave absorber can be installed only in limited locations. Moreover, as the glass layer is disposed, there are concerns that the total weight of the radio wave absorber may increase and impact on the radio wave absorber may break the glass layer to decrease the radio wave absorption performance.

Then, it is conceivable that in order to increase the flame retardancy of a λ/4 radio wave absorber, a flame retardant is included in its dielectric layer. The dielectric layer is in contact with a resistive layer made of a material such as a metal oxide and an electrically conductive layer formed of an electrical conductivity material such as a metal. Thus, inclusion of a flame retardant in the dielectric layer may cause an undesirable effect on the resistive layer or the electrically conductive layer. For example, the resistive layer or the electrically conductive layer may be detached or the properties of the resistive layer may change. Such effects are disadvantageous in terms of maintaining the radio wave absorption performance of the λ/4 radio wave absorber for a long period of time.

In view of such circumstances, the present invention provides a radio wave absorbing member that is advantageous in terms of maintaining the radio wave absorption performance of a λ/4 radio wave absorber for a long period of time and increasing the flame retardancy. The present invention also provides a radio wave absorbing structure including such a radio wave absorbing member and an inspection apparatus including such a radio wave absorbing member.

Solution to Problem

The present invention provides a radio wave absorbing member including:
a radio wave absorber including a resistive layer, a reflective layer that reflects a radio wave, and a dielectric layer disposed between the resistive layer and the reflective layer in the thickness direction of the reflective layer; and
a support having a sheet shape and supporting the radio wave absorber, wherein
the support includes a matrix resin and a flame retardant.

The present invention also provides a radio wave absorbing structure including:
a plurality of the above radio wave absorbing members, wherein
the plurality of radio wave absorbing members are disposed apart from each other.

The present invention also provides an inspection apparatus including:
a radio wave reflector; and
the above radio wave absorbing member, wherein
the radio wave absorbing member is disposed so as to absorb a radio wave travelling toward the radio wave reflector.

Advantageous Effects of Invention

The above radio wave absorbing member is advantageous in terms of maintaining the radio wave absorption performance of a λ/4 radio wave absorber for a long period of time and increasing the flame retardancy.

DESCRIPTION OF EMBODIMENTS

Hereinafter, embodiments of the present invention will be described with reference to the drawings. The present invention is not limited to the following embodiments.

Figure 1:
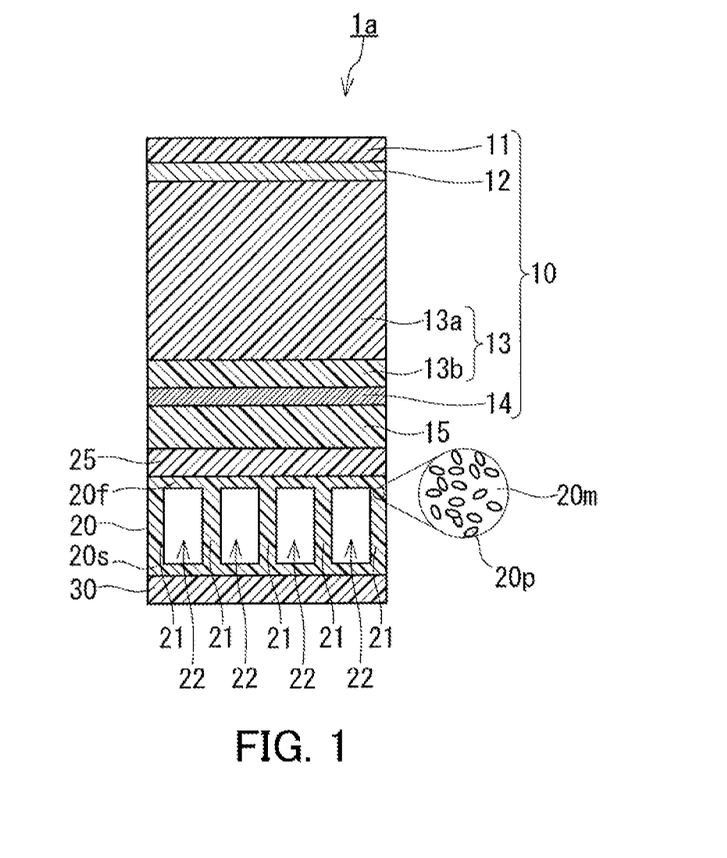
FIG. 1 is a cross-sectional view showing an example of a radio wave absorbing member according to the present invention.

As shown in FIG. 1, a radio wave absorbing member 1a includes a radio wave absorber 10 and a support 20 having a sheet shape. The radio wave absorber 10 includes a resistive layer 12, a reflective layer 14, and a dielectric layer 13. The reflective layer 14 reflects a radio wave. The dielectric layer 13 is disposed between the resistive layer 12 and the reflective layer 14 in the thickness direction of the reflective layer 14. The radio wave absorber 10 is typically a λ/4 radio wave absorber. The support 20 supports the radio wave absorber 10. The support 20 includes a matrix resin 20m and a flame retardant 20p. With the support 20 thus configured, the radio wave absorbing member 1a has desirable flame retardancy without including a flame retardant in the dielectric layer 13. Included in the support 20, the flame retardant 20p is unlikely to come into contact particularly with the resistive layer 12. Therefore, it is unlikely that the flame retardant 20p undesirably affects the resistive layer 12 by contact with the resistive layer 12, and the radio wave absorption performance of the radio wave absorber 10 is likely to be maintained for a long period of time.

The support 20 is typically disposed at a position closer to the reflective layer 14 than to the resistive layer 12. The support 20 may be in contact with or apart from the reflective layer 14 in the thickness direction of the reflective layer 14.

As shown in FIG. 1, the support 20 includes, for example, a void 22 inside the support 20. With such a configuration, an external impact on the radio wave absorbing member 1a can be absorbed by the support 20 including the void 22. Hence, the radio wave absorber 10 supported by the support 20 is likely to be protected from such an impact. As a result, the radio wave absorption performance of the radio wave absorber 10 is likely to be maintained for a long period of time.

The support 20 includes, for example, a partition 21. The partition 21 partitions the inside of the support 20 into a plurality of voids 22. The plurality of voids 22 are thus formed inside the support 20.

The support 20 includes, for example, a first liner 20f forming one principal surface of the support 20 and a second liner 20s forming the other principal surface of the support 20. The partition 21 connects, for example, the first liner 20f and the second liner 20s. In other words, the partition 21 functions as a rib in the support 20. For example, in the support 20, the plurality of partitions 21 extending in the same direction are aligned in a given direction. The support 20 may be produced by joining the first liner 20f, the second liner 20s, and the partition 21 or shaped integrally by extrusion.

In the support 20, the void 22 may be formed in the form of a bubble. In this case, the support 20 is, for example, a foam. The bubble forming the void 22 may be an isolated bubble or a continuous bubble.

The mass per unit area of the support 20 is, for example, 10 kg/m$^2$ or less. In this case, the weight of the radio wave absorbing member 1a is likely to be decreased. The mass per unit area of the support 20 may be 6 kg/m$^2$ or less or 3 kg m$^2$ or less. The mass per unit area of the support 20 is, for example, 0.2 kg/m$^2$ or more. In this case, the support 20 is likely to have a desired rigidity. The mass per unit area of the support 20 may be 0.3 kg/m$^2$ or more or 0.5 kg/m$^2$ or more.

The flexural modulus of the support 20 is, for example, 30 MPa or more. In this case, the radio wave absorbing member 1a is likely to have a desired flexural rigidity and the radio wave absorbing member 1a can be easily handled. The flexural modulus of the support 20 may be 50 MPa or more, 100 MPa or more, or 150 MPa or more. The flexural modulus of the support 20 is, for example, 5000 MPa or less. In this case, the radio wave absorbing member 1a can be easily handled. The flexural modulus of the support 20 may be 4000 MPa or less, 3000 MPa or less, or 1000 MPa or less.

The flexural modulus of the support 20 can be determined, for example, as follows. A rectangle having a width of 50 mm and a length of 150 mm is cut out from the support 20 to produce a specimen. The specimen is subjected to a bending test using a bending tester under the following test conditions. The flexural modulus can be calculated, as defined in Japanese Industrial Standards (JIS) K 7171, based on the amount of strain and the flexural stress after calculation of deflections s1 and s2 respectively corresponding to flexural strains ε1=0.0005 and ε2=0.0025. Test condition: three-point bending; span between supports: 100 mm; test speed: 10 mm/min; environmental temperature: room temperature (23° C.)

The matrix resin 20m is not limited to a particular resin, and can be any known resin. As the matrix resin 20m there can be used, for example, a resin such as polyethylene, polypropylene, ethylene propylene block copolymer, polypropylene copolymer, polycarbonate, polyester, polystyrene, or acrylic resin. The matrix resin 20m may be a resin including a foaming agent and forming a foam.

The flame retardant 20p is not limited to a particular flame retardant, and can be any known flame retardant. The flame retardant 20p may be made of an inorganic material or an organic material. As the flame retardant 20p there can be used, for example, a bromine-containing flame retardant, a phosphorus-containing flame retardant, or an inorganic flame retardant. As the bromine-containing flame retardant there can be used, for example, polybrominated diphenyl ether (PBDE), tetrabromobisphenol A (TBBA), or brominated polystyrene. As the phosphorus-containing flame retardant can be used an aromatic phosphoric acid ester such as triphenyl phosphate, a condensed aromatic phosphoric acid ester such as 1,3-phenylene bis(diphenyl phosphate), a halogen-containing phosphoric acid ester such as tris (dichloropropyl)phosphate, a halogen-condensed phosphoric acid ester such as 2,2-bis(chloromethyl)trimethylene bis(bis (2-chloroethyl)phosphate), a metal salt of phosphinic acid, an ammonium salt of polyphosphoric acid, or red phosphorus. As the inorganic flame retardant there can be used a metal hydroxide such as magnesium hydroxide or aluminum hydroxide or a mineral such as antimony trioxide, antimony pentoxide, or talc.

The flame retardant 20p is desirably in the form of particles including an inorganic material. In this case, the radio wave absorbing member 1a more reliably has desired flame retardancy. Moreover, when the flame retardant 20p is made of an inorganic material, the support 20 is likely to have high flexural rigidity. Examples of the inorganic material can include the materials mentioned as examples of the above inorganic flame retardant.

The content of the flame retardant 20p in the support 20 is not limited to a particular value. The content of the flame retardant 20p in the support 20 is, for example, 1 to 70 mass %. In this case, the radio wave absorbing member 1a more reliably has desired flame retardancy and the formability of the support 20 is likely to be good. The content of the flame retardant 20p in the support 20 may be, for example, 3 to 60 mass % or 5 to 50 mass %.

The average burn rate of the radio wave absorbing member 1a is not limited to a particular value. The average burn rate of the radio wave absorbing member 1a can be determined by producing a specimen for a flammability test as in Federal Motor Vehicle Safety Standards (FMVSS) No. 302 using the radio wave absorbing member 1a, performing the flammability test several times according to FMVSS No.

302, and dividing the sum of the resulting burn rates obtained by the flammability test by the number of times the test was performed. The average burn rate of the radio wave absorbing member 1a is, for example, 15.0 mm/min or less, desirably 14.0 mm/min or less, more desirably 13.0 mm/min or less, even more desirably 12.0 mm/min or less, particularly desirably 11.0 mm/min or less, and extremely desirably 10.0 mm/min or less. The average burn rate of the radio wave absorbing member 1a is, for example, 1.0 mm/min or more, and may be 1.5 mm/min or more or 2.0 mm/min or more.

The radio wave absorber 10 is designed so that incidence of a radio wave that is to be absorbed and has a wavelength Xo on the radio wave absorber 1a will result in interference between a radio wave reflected by a surface of the resistive layer 12 (front surface reflection) and a radio wave reflected by the reflective layer 14 (back surface reflection). In the radio wave absorber 10, the wavelength Xo of the radio wave to be absorbed is determined from the thickness t of the dielectric layer 13 and the relative permittivity $\varepsilon_r$ of the dielectric layer 13, as shown in the following equation (1). In the equation (1), sqrt($\varepsilon_r$) means a square root of the relative permittivity $\varepsilon_r$.

$$\lambda_O = 4t \times \text{sqrt}(\varepsilon_r) \qquad \text{Equation (1)}$$

The resistive layer 12 is typically a layer adjusted so that an impedance expected on its front surface will be equal to a characteristic impedance of a plane wave. The resistive layer 12 can be formed of, for example, a metal, an alloy including a non-metal element, a metal oxide, an electrically conductive polymer, a carbon nanotube, a metal nanowire, or a metal mesh. The resistive layer 12 may include indium tin oxide. When the resistive layer 12 includes indium tin oxide, the content of tin oxide in the indium tin oxide is, for example, 20 to 40 mass %. In this case, the resistive layer 12 can be formed by annealing treatment of indium tin oxide in a stable polycrystalline state. As a result, the radio wave absorption performance of the radio wave absorber 10 is likely to be maintained for a long period of time.

As shown in FIG. 1, the radio wave absorbing member 1a further includes, for example, a substrate 11. The resistive layer 12 is arranged, for example, on one principal surface of the substrate 11. The substrate 11, for example, serves as a support supporting the resistive layer 12. The material of the substrate 11 is, for example, polyethylene terephthalate (PET), polyethylene naphthalate (PEN), acrylic resin (PMMA), polycarbonate (PC), polyimide (PI), or cycloolefin polymer (COP). Among these, the material of the substrate 11 is desirably PET in terms of the balance between good heat resistance, the dimensional stability, and the manufacturing cost.

The thickness of the substrate 11 is, for example, 10 to 150 μm and is desirably 15 to 100 μm. In this case, the substrate 11 has a low flexural rigidity, and occurrence of a crease in the substrate 11 or deformation of the substrate 11 at the time of formation of the resistive layer 12 can be reduced.

The relative permittivity of the dielectric layer 13 is, for example, 2.0 to 20.0. In this case, the thickness of the dielectric layer 13 is easily adjusted and the radio wave absorption performance of the radio wave absorber 10 is easily adjusted. The relative permittivity of the dielectric layer 13 is, for example, a relative permittivity measured at 10 GHz by a cavity resonance method.

The dielectric layer 13 is formed of, for example a given polymer. The dielectric layer 13 includes, for example, at least one polymer selected from the group consisting of ethylene vinyl acetate copolymer, vinyl chloride resin, urethane resin, acrylic resin, acrylic urethane resin, polyethylene, polypropylene, silicone, polyethylene terephthalate, polyethylene naphthalate, polycarbonate, polyimide, and cycloolefin polymer. In this case, the thickness of the dielectric layer 13 is easily adjusted and the manufacturing cost of the radio wave absorbing member 1a can be maintained at a low level. The dielectric layer 13 can be produced, for example, by hot-pressing a given resin composition.

The dielectric layer 13 may be formed as a single layer or as a plurality of layers made of the same material or different materials. When the dielectric layer 13 includes n layers (n is an integer of 2 or greater), the relative permittivity of the dielectric layer 13 is determined, for example, as follows. The relative permittivity $\varepsilon_i$ of each layer is measured (i is an integer of 1 to n). Next, the relative permittivity $\varepsilon_i$ of each layer is multiplied by the proportion of the thickness $t_i$ of the layer in the total thickness T of the dielectric layer 13 to determine $\varepsilon_i \times (t_i/T)$. The relative permittivity of the dielectric layer 13 can be determined by adding the $\varepsilon_i \times (t_i/T)$ values of all layers.

As shown in FIG. 1, the dielectric layer 13 includes, for example, a first layer 13a and a second layer 13b. The first layer 13a is in contact with the resistive layer 12. The second layer 13b is disposed between the first layer 13a and the reflective layer 14.

The dielectric layer 13 includes, for example, no flame retardant. In this case, it is less likely that the resistive layer 12 and the reflective layer 14 are undesirably affected by a flame retardant, and the radio wave absorption performance of the radio wave absorber 10 is likely to be maintained for a long period of time.

The reflective layer 14 is not particularly limited as long as the reflective layer 14 can reflect a radio wave to be absorbed. The reflective layer 14 has, for example, a given electrical conductivity. The reflective layer 14 may include, for example, at least one selected from the group consisting of aluminum, copper, iron, aluminum alloys, copper alloys, and iron alloys. In this case, the thickness of the reflective layer 14 is likely to be reduced. The reflective layer 14 may be a metal oxide such as indium tin oxide as long as the reflective layer 14 has the given electrical conductivity.

The thickness of the reflective layer 14 is not limited to a particular value. The thickness of the reflective layer 14 is, for example, 20 nm to 100 μm and is desirably 50 nm to 50 μm.

As shown in FIG. 1, the radio wave absorbing member 1a further includes, for example, a substrate 15. The reflective layer 14 is arranged, for example, on one principal surface of the substrate 15. The substrate 15, for example, serves as a support supporting the reflective layer 14. The material of the substrate 15 is, for example, polyethylene terephthalate (PET), polyethylene naphthalate (PEN), acrylic resin (PMMA), polycarbonate (PC), polyimide (PI), or cycloolefin polymer (COP). Among these, the material of the substrate 15 is desirably PET in terms of the balance between good heat resistance, the dimensional stability, and the manufacturing cost.

As shown in FIG. 1, the radio wave absorbing member 1a further includes, for example, an adhesive layer 25 and an adhesive layer 30. The adhesive layer 25 is disposed between the radio wave absorber 10 and the support 20. For example, the adhesive layer 25 achieves integration of the support 20 and the radio wave absorber 10 to give the radio wave absorbing member 1a.

The adhesive layer 30 is arranged on a principal surface of the support 20. The principal surface is remote from the radio wave absorber 10. For example, the radio wave absorbing member 1a can be disposed at a given position by pressing the adhesive layer 30 against a given plane.

The adhesive layer 25 and the adhesive layer 30 each include, for example, a rubber adhesive, an acrylic adhesive, a silicone adhesive, or a urethane adhesive. The radio wave absorbing member 1a may further include a release liner (not illustrated). In this case, the release liner covers the adhesive layer 30. Typically, the release liner can maintain the adhesive strength of the adhesive layer 30 while covering the adhesive layer 30, and the release liner can be easily peeled off from the adhesive layer 30. The release liner is, for example, a film made of a polyester resin such as PET. The adhesive layer 30 is exposed by peeling off the release liner, so that the radio wave absorbing member 1a is able to stick to a given plane.

The radio wave absorbing member 1a can be modified in various respects. For example, the reflective layer 14 may be arranged on one principal surface of the support 20. In this case, the substrate 15 and the adhesive layer 25 can be omitted, and the surface of the dielectric layer 13, the surface being in contact with the reflective layer 14, can be formed as an adhesive surface.

Figure 2:
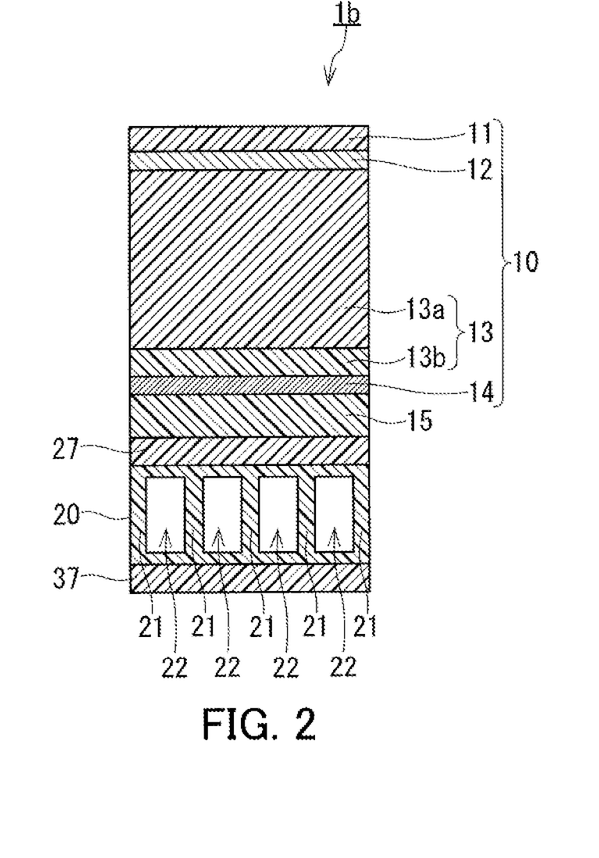
FIG. 2 is a cross-sectional view showing another example of the radio wave absorbing member according to the present invention.
Figure 3:
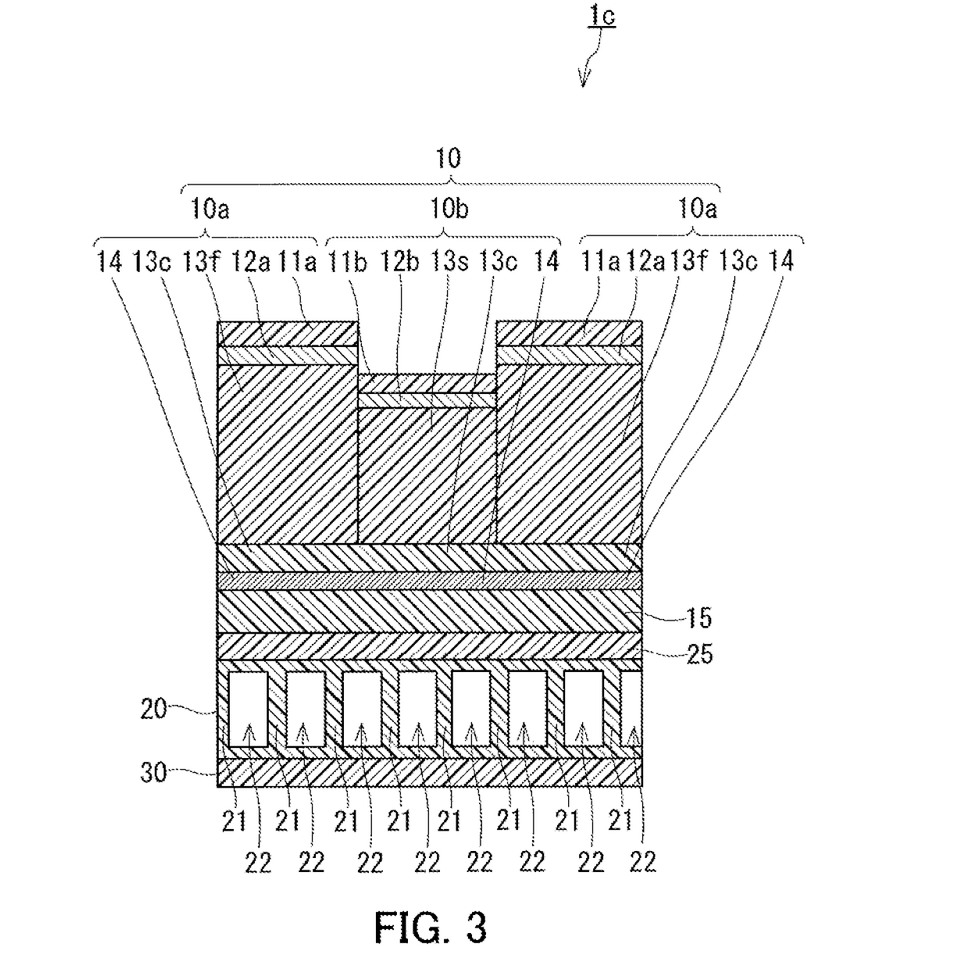
FIG. 3 is a cross-sectional view showing yet another example of the radio wave absorbing member according to the present invention.

The radio wave absorbing member 1a may be modified to a radio wave absorbing member 1b shown in FIG. 2 or a radio wave absorbing member 1c shown in FIG. 3. The radio wave absorbing members 1b and 1c are configured in the same manner as the radio wave absorbing member 1a unless otherwise described. The components of the radio wave absorbing members 1b and 1c that are the same as or correspond to the components of the radio wave absorbing member 1a are denoted by the same reference characters, and detailed descriptions of such components are omitted. The description given for the radio wave absorbing member 1a is applicable to the radio wave absorbing members 1b and 1c unless there is a technical inconsistency.

As shown in FIG. 2, the radio wave absorbing member 1b further includes, a flame-retardant layer 27. The flame-retardant layer 27 is disposed between the support 20 and the radio wave absorber 10 and includes a flame retardant. Having such a configuration, the radio wave absorbing member 1b is likely to have higher flame retardancy.

The flame retardant included in the flame-retardant layer 27 may be the same flame retardant as the flame retardant 20p included in the support 20 or may be a different flame retardant therefrom.

The flame-retardant layer 27 may further include, for example, an adhesive. In this case, the flame-retardant layer 27 achieves integration of the support 20 and the radio wave absorber 10.

As shown in FIG. 2, the radio wave absorbing member 1b further includes a flame-retardant layer 37. The flame-retardant layer 37 is arranged on a principal surface of the support 20. The principal surface is remote from the radio wave absorber 10 and includes a flame retardant. Having such a configuration, the radio wave absorbing member 1b is likely to have higher flame retardancy. The flame retardant included in the flame-retardant layer 37 may be the same flame retardant as the flame retardant 20p included in the support 20 or may be a different flame retardant therefrom. The flame-retardant layer 37 may include, for example, an adhesive. This makes it possible to dispose the radio wave absorbing member 1b at a given position by pressing the radio wave absorbing member 1b against a given plane.

In the radio wave absorbing member 1c, the radio wave absorber 10 includes a plurality of radio wave absorbing portions. The radio wave absorber 10 includes, for example, a first radio wave absorbing portion 10a and a second radio wave absorbing portion 10b. The first radio wave absorbing portion 10a has the largest amount of reflection and absorption of a radio wave having a given frequency, as measured according to Japanese Industrial Standards (JIS) R 1679:2007, at a first incident angle in the incident angle range of 0° to 80°. The second radio wave absorbing portion 10b has the largest amount of reflection and absorption of a radio wave having a given frequency, as measured according to JIS R 1679:2007, at a second incident angle in the incident angle range of 0° to 80°. In the radio wave absorber 10, the second incident angle is different from the first incident angle, or the polarized wave type of, a radio wave incident at the second incident angle is different from the polarized wave type of a radio wave incident at the first incident angle. The term "amount of reflection and absorption" is synonymous with, for example, the absolute value of a return loss S (dB) defined by the following equation (2). In the equation (2), PO is received power (W/m2) obtained from reflection by a metal plate, and Pi is received power (W/m2) obtained from reflection by a sample. Additionally, the amount of reflection and absorption corresponds to the absolute value of the amount of reflection as in JIS R 1679:2007.

$$S = 10 \log |Pi/PO| \qquad \text{Equation (2)}$$

As shown in FIG. 3, the first radio wave absorbing portion 10a is composed of, for example, a first resistive layer 12a, a first dielectric layer 13f, a common dielectric layer 13c, and the reflective layer 14. The first radio wave absorbing portion 10a further includes, for example, a first substrate 11a. The second radio wave absorbing portion 10b is composed of, for example, a second resistive layer 12b, a second dielectric layer 13s, the common dielectric layer 13c, and the reflective layer 14. The second radio wave absorbing portion 10b further includes, for example, a second substrate 11b.

The radio wave absorbing member 1c is likely to exhibit the desired absorption performance with respect to a radio wave incident at an incident angle in a wide range or a variety of polarized waves.

In the radio wave absorbing member 1c, the first and second radio wave absorbing portions 10a and 10b are disposed over the same support 20. The first and second radio wave absorbing portions 10a and 10b may be disposed on different supports 20.

In the radio wave absorbing member 1c, the first and second radio wave absorbing portions 10a and 10b are disposed, for example, over the same adhesive layer 25. The first and second radio wave absorbing portions 10a and 10b may be disposed on different adhesive layers 25.

In the radio wave absorbing member 1c, the first and second radio wave absorbing portions 10a and 10b are disposed, for example, over the same adhesive layer 30. The first and second radio wave absorbing portions 10a and 10b may be disposed on different adhesive layers 30.

In the radio wave absorbing member 1c, there is arranged the reflective layer 14 shared by the first and second radio wave absorbing portions 10a and 10b. The reflective layer 14 may be arranged in each of the first and second radio wave absorbing portions 10a and 10b.

The applications of the radio wave absorbing members 1a, 1b, and 1c are not particularly limited. For example, an inspection apparatus 100 shown in FIG. 4 can be provided with the use of the radio wave absorbing member 1a. The inspection apparatus 100 includes radio wave reflectors 2a and 2b and the radio wave absorbing member 1a. The radio wave absorbing member 1a is disposed so as to absorb a radio wave travelling toward the radio wave reflectors 2a and 2b.

Figure 4:
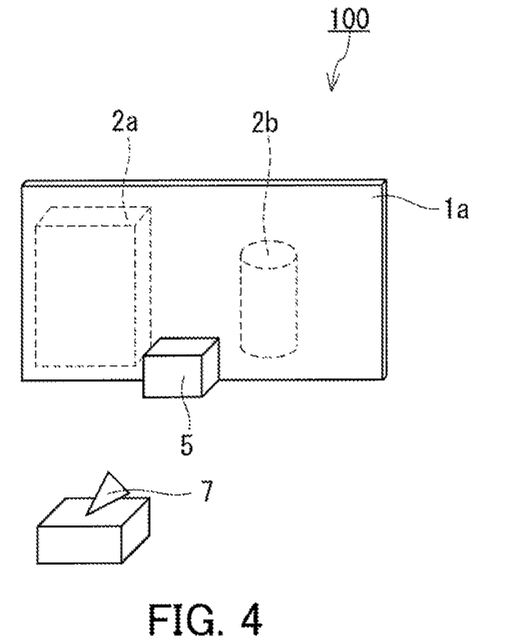
FIG. 4 is a perspective view showing an example of an inspection apparatus according to the present invention.

The inspection apparatus 100 further includes, for example, a target 5. In the inspection apparatus 100, for example, a device to be inspected is disposed so as to face the target 5. The device to be inspected includes, for example, an antenna 7 and uses a given radio wave for sensing. A radio wave emitted from the antenna 7 of the device to be inspected is reflected by the target 5, and the reflected radio wave is led to the antenna 7 of the device to be inspected. Whether the device to be inspected can appropriately detect the target 5 can be inspected in this manner.

The radio wave reflectors 2a and 2b are, for example, a housing of a measuring instrument needed for inspection using the inspection apparatus 100 or a jig. But for the radio wave absorbing member 1a in the inspection apparatus 100, the radio wave emitted from the antenna 7 would be reflected by the radio wave reflectors 2a and 2b and then led back to the antenna 7. The radio waves reflected by the radio wave reflectors 2a and 2b are, however, unnecessary radio waves, which need to be excluded for accurate inspection. With the radio wave absorbing member 1a disposed as shown in FIG. 4, the radio wave emitted from the device to be inspected can be prevented from being reflected by the radio wave reflectors 2a and 2b and being led to the device to be inspected. Therefore, the inspection apparatus 100 can appropriately inspect the device to be inspected.

The radio wave absorbing member 1a is, for example, disposed so that a radio wave emitted from the antenna 7 can be incident perpendicularly on the radio wave absorbing member 1a. In other words, the radio wave absorbing member 1a is disposed, for example, behind the target 5. In some cases, the radio wave reflectors 2a and 2b can be disposed on a lateral side of a space between the antenna 7 and the target 5. Therefore, the radio wave absorbing member 1a may be disposed on a lateral side of and along a space between the antenna 7 and the target 5.

In the inspection apparatus 100, the radio wave absorbing member 1b or the radio wave absorbing member 1c may be disposed instead of the radio wave absorbing member 1a.

Figure 5:
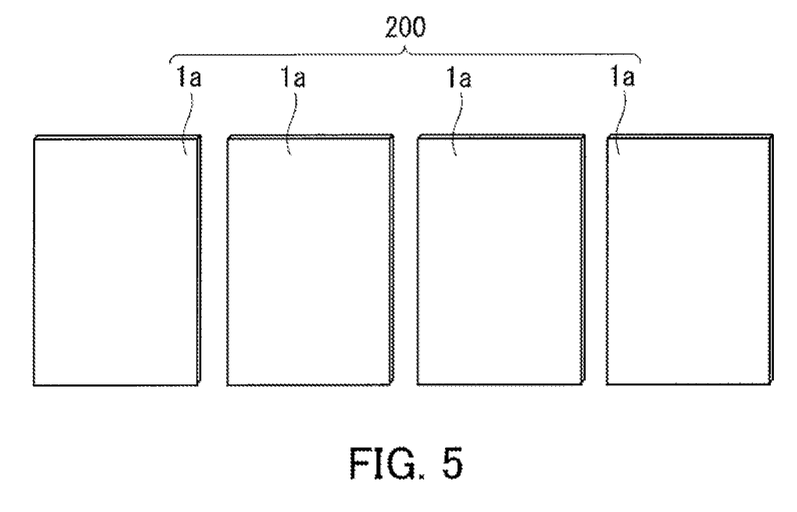
FIG. 5 is a perspective view showing an example of a radio wave absorbing structure according to the present invention.

For example, a radio wave absorbing structure 200 shown in FIG. 5 can be provided with the use of the radio wave absorbing member 1. The radio wave absorbing structure 200 includes the plurality of radio wave absorbing members 1a. In the radio wave absorbing structure 200, the plurality of radio wave absorbing members 1a are disposed apart from each other.

Since the plurality of radio wave absorbing members 1a are disposed apart from each other in the radio wave absorbing structure 200, the arrangement of the radio wave absorbing members 1a is unlikely to be affected by a dimensional difference between the adjacent radio wave absorbing members 1a. Therefore, the plurality of radio wave absorbing members 1a are appropriately disposed throughout the radio wave absorbing structure 200. In the radio wave absorbing structure 200, the radio wave absorbing member 1a may be composed of one piece or may be composed of a plurality of pieces connected to each other. In the radio wave absorbing structure 200, the plurality of radio wave absorbing members 1b or the plurality of radio wave absorbing members 1c, instead of the radio wave absorbing members 1a, may be disposed apart from each other.

EXAMPLES

The present invention will be described in more detail by examples. The present invention is not limited to the examples given below.

Example 1

A resistive layer having a sheet resistance of 370Ω/□ was formed on a 23-μm-thick PET film by sputtering using ITO as a target material. A resistive layer-including film was obtained in this manner. An acrylic resin layer was obtained by shaping an acrylic resin having a relative permittivity of 2.6 to a thickness of 560 μm. The resistive layer-including film was stacked on the acrylic resin layer so that the resistive layer of the resistive layer-including film would be in contact with the acrylic resin layer. The resistive layer-including film was adhered to the acrylic resin layer without using an adhesive.

An electrical conductor-including film in which a 7-μm-thick aluminum foil is sandwiched between a 25-μm-thick PET film and a 9-μm-thick PET film and the aluminum foil and the PET films are laminated was prepared. The electrical conductor-including film and the laminate consisting of the resistive layer-including film and the acrylic resin layer were stacked so that the electrical conductor-including film would be in contact with the acrylic resin layer of the laminate. A radio wave absorber was obtained in this manner.

A commercially-available resin corrugated cardboard (manufactured by SUMIKA PLASTECH Co., Ltd., product name: WT09300) was prepared as a support. The support included talc serving as a flame retardant. The support had a thickness of 9 mm. A double-faced adhesive tape (manufactured by Nitto Denko Corporation, product name: No. 5635) was disposed between the electrical conductor-including film of the radio wave absorber and the corrugated cardboard, and then the radio wave absorber was stuck to the corrugated cardboard. The double-faced adhesive tape had a thickness of 0.15 mm and included no flame retardant. A radio wave absorbing member according to Example 1 was obtained in this manner.

Example 2

A radio wave absorbing member according to Example 2 was obtained in the same manner as in Example 1, except that a double-faced adhesive tape TR-5912F including a flame retardant and manufactured by Nitto Denko Corporation was used instead of the double-faced adhesive tape No. 5635 manufactured by Nitto Denko Corporation and that two pieces of the double-faced adhesive tape TR-5912F were stacked and disposed between the electrical conductor-including film of the radio wave absorber and the corrugated cardboard. Each piece of the double-faced adhesive tape had a thickness of 0.125 mm.

Comparative Example 1

A radio wave absorber as described above and not stuck to a corrugated cardboard was used as a radio wave absorbing member according to Comparative Example 1.

Comparative Example 2

A radio wave absorbing member according to Comparative Example 2 was obtained in the same manner as in Example 1, except that an acrylic resin sheet was used as a support instead of the resin corrugated cardboard. The acrylic resin sheet had a thickness of 2.0 mm.

Comparative Example 3

A radio wave absorbing member according to Comparative Example 3 was obtained in the same manner as in Example 1, except that a hollow polycarbonate board KTP4534W-1, which is a resin corrugated cardboard manufactured by AiTec and including no flame retardant, was used as a support. The corrugated cardboard had a thickness of 4.00 mm.

<Ball Drop Test>

The radio wave absorbing member according to Example 1 and the radio wave absorbing members according to Comparative Examples 1 and 2 were subjected to a ball drop test. A metal ball having a weight of 500 g and a diameter of 50 mm was used in the ball drop test. The metal ball was allowed to fall freely seven times from a height of 300 mm to each radio wave absorbing member cut into A4 size. A visual comparison of damage caused by the falling metal ball was made between the radio wave absorbing member according to Example 1 and the radio wave absorbing member according to Comparative Example 1. The comparison revealed that the damage on the radio wave absorbing member according to Comparative Example 1 was more severe than that on the radio wave absorbing member according to Example 1. Before and after the ball drop test, the amount of radio wave reflection was measured according to JIS R 1679:2007 for the radio wave absorbing members according to Example 1 and Comparative Example 2 using a 76-GHz millimeter wave perpendicularly incident thereon. For the seven points on each radio wave absorbing member, the seven points where the falls of the ball thereto were confirmed, the average difference Δave in amounts of radio wave reflection was determined by subtracting the average of the amounts of radio wave reflection before the ball drop test from the average of the amounts of radio wave reflection after the ball drop test. Table 1 shows the results. It is indicated that impact made by a falling ball is easily absorbed by the corrugated cardboard of the radio wave absorbing member according to Example 1 and the amount of radio wave reflection by the radio wave absorbing member according to Example 1 is maintained easily regardless of a fall of the ball.

<Flammability Test>

A specimen for a flammability test as in FMVSS No. 302 was produced from each of the radio wave absorbing members according to Example 1, Example 2, and Comparative Example 3. A marked line A and a marked line B were drawn respectively at positions 38 mm and 292 mm away from one end in the longitudinal direction of the specimen. The one end in the longitudinal direction of the specimen was exposed to a 38-mm-long flame for 15 seconds, and the burn rate in the 254-mm-long zone between the marked line A and marked line B was determined according to FMVSS No. 302. The radio wave absorbing members according to Example 1, Example 2, and Comparative Example 3 were each subjected to the flammability test several times. The sum of the burn rates obtained by the flammability test was divided by the number of times the test was performed to determine the average burn rate of each of the radio wave absorbing members according to Example 1, Example 2, and Comparative Example 3. Table 2 shows the results. As shown in Table 2, the average burn rates of the radio wave absorbing members according to Example 1 and Example 2 were lower than the average burn rate of the radio wave absorbing member according to Comparative Example 3. This indicates that in terms of increasing the flame retardancy of a radio wave absorbing member, inclusion of a flame retardant in a support is advantageous. Additionally, the average burn rate of the radio wave absorbing member according to Example 2 was lower than the average burn rate of the radio wave absorbing member according to Example 1. This indicates that in terms of increasing the flame retardancy of a radio wave absorbing member, inclusion of a flame retardant in a layer disposed between a radio wave absorber and a support is advantageous.

TABLE 1

| | Support | Average difference Δave in amounts of radio wave reflection [dB] |
| --- | --- | --- |
| Example 1 | Resin corrugated cardboard including flame retardant | 0.1 |
| Comparative Example 2 | Acrylic resin sheet | 1.8 |

TABLE 2

| | Flame retardant in support | Flame retardant in double-faced adhesive tape | Average burn rate [mm/min] |
| --- | --- | --- | --- |
| Example 1 | Included | Not included | 6.1 |
| Example 2 | Included | Included | 4.8 |
| Comparative Example 3 | Not included | Not included | 15.5 |

The invention claimed is:

1. A radio wave absorbing member comprising:
a radio wave absorber comprising a resistive layer, a reflective layer that reflects a radio wave, and a dielectric layer disposed between the resistive layer and the reflective layer in the thickness direction of the reflective layer; and
a support having a sheet shape and supporting the radio wave absorber, wherein
the support comprises a matrix resin and a flame retardant, and
the support is disposed at a position closer to the reflective layer than to the resistive layer.

2. The radio wave absorbing member according to claim 1, wherein the support comprises a void inside the support.

3. The radio wave absorbing member according to claim 2, wherein the support comprises a partition partitioning the inside of the support into a plurality of the voids.

4. The radio wave absorbing member according to claim 1, wherein the flame retardant is in the form of particles comprising an inorganic material.

5. The radio wave absorbing member according to claim 1, further comprising a flame-retardant layer disposed between the support and the radio wave absorber, the flame-retardant layer comprising a flame retardant.

6. The radio wave absorbing member according to claim 1, wherein the dielectric layer comprises no flame retardant.

7. A radio wave absorbing structure comprising:
a plurality of the radio wave absorbing members according to claim 1, wherein
the plurality of radio wave absorbing members are disposed apart from each other.

8. An inspection apparatus comprising:
a radio wave reflector; and the radio wave absorbing member according to claim 1, wherein the radio wave absorbing member is disposed so as to absorb a radio wave travelling toward the radio wave reflector.

\* \* \* \* \*